(12) United States Patent
Strasser (10) Patent No.: US 12,181,497 B2
(45) Date of Patent: Dec. 31, 2024

(54) VOLTAGE MEASUREMENT AND/OR OVERVOLTAGE PROTECTION CIRCUIT FOR A MEASUREMENT INSTRUMENT

(71) Applicant: Rohde & Schwarz GmbH & Co. KG, Munich (DE)

(72) Inventor: Franz Strasser, Niclasreuth (DE)

(73) Assignee: Rohde & Schwarz GmbH & Co. KG, Munich (DE)

( * ) Notice: Subject to any disclaimer, the term of this patent is extended or adjusted under 35 U.S.C. 154(b) by 244 days.

(21) Appl. No.: 18/058,644

(22) Filed: Nov. 23, 2022

(65) Prior Publication Data

US 2024/0168060 A1 May 23, 2024

(51) Int. Cl.
*G01R 1/36* (2006.01)
*G01R 15/12* (2006.01)

(52) U.S. Cl.
CPC ............ *G01R 1/36* (2013.01); *G01R 15/125* (2013.01)

(58) Field of Classification Search
CPC ......... G01R 1/36; G01R 15/125; G01R 15/04
USPC .................................... 324/110, 76.11, 76.22
See application file for complete search history.

(56) References Cited

U.S. PATENT DOCUMENTS

| 4,034,291 | A | 7/1977 | Allen et al. |
|---|---|---|---|
| 9,696,345 | B2* | 7/2017 | Javora ...................... G01R 1/18 |
| 10,352,967 | B2* | 7/2019 | Steuer .................. G01R 15/207 |
| 2010/0277190 | A1 | 11/2010 | Reichel et al. |
| 2015/0054492 | A1 | 2/2015 | Mende et al. |
| 2017/0296056 | A1* | 10/2017 | Hresko ................. A61B 5/0015 |
| 2020/0001048 | A1* | 1/2020 | Oren ......................... G06T 7/70 |
| 2020/0338351 | A1* | 10/2020 | Panken ................ A61N 1/0534 |
| 2023/0266369 | A1* | 8/2023 | Mende ............... G01R 1/06766 |
| | | | 324/149 |

* cited by examiner

*Primary Examiner* — Giovanni Astacio-Oquendo
(74) *Attorney, Agent, or Firm* — Studebaker & Brackett PC (57) ABSTRACT

A voltage measurement and/or overvoltage protection circuit for a measurement instrument comprising a measurement channel with at least one termination resistor and a measurement port is provided. Said voltage measurement and/or overvoltage protection circuit comprises at least one resistor. In this context, the voltage measurement and/or overvoltage protection circuit is contactable to the measurement port via said at least one resistor. In addition to this, a resistance of the at least one resistor is higher than a maximum resistance of the at least one termination resistor.

20 Claims, 3 Drawing Sheets

VOLTAGE MEASUREMENT AND/OR OVERVOLTAGE PROTECTION CIRCUIT FOR A MEASUREMENT INSTRUMENT

TECHNICAL FIELD

The disclosure relates to voltage measurement and/or overvoltage protection in the context of measurements instruments. In particular, the disclosure relates to a voltage measurement and/or overvoltage protection circuit for a measurement instrument, a measurement instrument comprising such a circuit, and an overvoltage protection method for operating a measurement instrument.

BACKGROUND ART

Generally, in times of an increasing number of applications employing circuitry, there is a growing need of a voltage measurement and/or overvoltage protection circuit for a measurement instrument, a measurement instrument comprising such a circuit, and an overvoltage protection method for operating a measurement instrument to perform measurements with respect to a device under test comprising such an application for verifying correct functioning of said applications in a highly accurate and efficient manner, wherein a safe operation of the measurement instrument can also be ensured.

US 2015/0054492 A1 discloses a probe for use with a test and measurement instrument. The probe includes a digital multimeter or voltmeter with an analog-to-digital converter configured to measure a signal from a device under test and determine a digital measurement from the signal, a controller connected to the multimeter or voltmeter configured to receive the digital measurement from the multimeter or voltmeter, a digital communication interface connected to the controller configured to communicate with the controller, and a communication link connected to the digital communication interface and the analog signal interface to communicate with the test and measurement instrument.

Furthermore, in accordance with U.S. Pat. No. 4,034,291 A, an oscilloscope and a digital multimeter are combined in a single housing to provide a portable electronic measurement instrument, wherein a substantial portion of circuitry is common to both measurement systems.

Moreover, US 2010/0277190 A1 relates to a test-signal detection system providing a probe, a first transmission line and a measuring device. The probe is connected to the measuring device by the first transmission line. The first transmission line transmits broadband test signals to the measuring device. The test-signal detection system provides at least one further transmission line. The probe is additionally connected to the measuring device at least indirectly by the at least one further transmission line. The at least one further transmission line transmits DC-voltage test signals to the measuring device.

Disadvantageously, none of the above-mentioned probe and measurement device or system, respectively, does allow for a highly accurate and efficient measurement and a safe operation of the corresponding measurement equipment.

SUMMARY

Thus, there is a need to provide a voltage measurement and/or overvoltage protection circuit for a measurement instrument, a measurement instrument comprising such a circuit, and an overvoltage protection method for operating a measurement instrument to perform measurements in a highly accurate and efficient manner, wherein a safe operation of the measurement instrument can also be ensured.

This is achieved by the embodiments provided in the enclosed independent claims. Advantageous implementations of the present disclosure are further defined in the dependent claims.

According to a first aspect of the invention, a voltage measurement and/or overvoltage protection circuit for a measurement instrument comprising a measurement channel with at least one termination resistor and a measurement port is provided. Said voltage measurement and/or overvoltage protection circuit comprises at least one resistor. In this context, the voltage measurement and/or overvoltage protection circuit is contactable to the measurement port via said at least one resistor. In addition to this, a resistance of the at least one resistor is higher than a maximum resistance of the at least one termination resistor. Advantageously, measurements are performed in a highly accurate and efficient manner, wherein a safe operation of the measurement instrument can also be ensured.

According to a first preferred implementation form of the first aspect of the invention, the resistance of the at least one resistor is at least 10 times higher, preferably at least 15 times higher, more preferably at least 20 times higher, most preferably at least 25 times higher, than the maximum resistance of the at least one termination resistor. Advantageously, for instance, a mismatch especially in the context of the at least one termination resistor can efficiently be prevented.

With respect to the resistance of the at least one resistor, it is noted that it might be particularly advantageous if said resistance of the at least one resistor is between 5 Megaohm and 50 Megaohm, preferably between 10 Megaohm and 40 Megaohm, more preferably between 15 Megaohm and 30 Megaohm, most preferably between 20 Megaohm and 25 Megaohm.

According to a second preferred implementation form of the first aspect of the invention, the at least one resistor comprises at least a first resistor for contacting the measurement port and a second resistor following said first resistor. Advantageously, for example, both accuracy and efficiency can further be increased.

With respect to said following of the second resistor regarding the first resistor, it is noted that said second resistor may especially be connected in series to said first resistor.

According to a further preferred implementation form of the first aspect of the invention, the first resistor comprises or is of a first construction form. Additionally, the second resistor comprises or is of a second construction form. In further addition to this, the first construction form is smaller than the second construction form. Advantageously, for instance, a mismatch especially in the context of the at least one termination resistor can be kept as small as possible.

With respect to the first construction form, it is noted that said first construction form may especially be a first surface-mounted device (SMD) construction form. Additionally or alternatively, the second construction form may especially be a second SMD construction form.

In this context, it is noted that it might be particularly advantageous if the first resistor is of a first SMD construction form being not greater than 0201 or 0402. In addition to this or as an alternative, the second resistor may be of a second SMD construction form being at least 1206.

In further addition to this or as a further alternative, the second resistor may preferably comprise a smaller temperature coefficient and/or a higher resistance than the first resistor.

According to a further preferred implementation form of the first aspect of the invention, the voltage measurement and/or overvoltage protection circuit further comprises an amplifier, preferably an operational amplifier, for dividing a voltage provided by the at least one resistor according to a defined factor and/or buffering said voltage provided by the at least one resistor in order to provide a divided and/or buffered voltage. Advantageously, for example, not only inaccuracies but also inefficiencies can further reduced.

With respect to the amplifier or the operational amplifier, respectively, it is noted that said amplifier or said operational amplifier, respectively, especially an input thereof, may be connected to the measurement port via the at least one resistor or a series connection of the first resistor and the second resistor, respectively.

According to a further preferred implementation form of the first aspect of the invention, the voltage measurement and/or overvoltage protection circuit further comprises an analog-to-digital converter for digitizing the divided and/or buffered voltage in order to provide a digitized voltage. Advantageously, for example, further processing can be performed in a particular efficient manner.

With respect to the analog-to-digital converter, it is noted that said analog-to-digital converter, especially an input thereof, can be connected to the above-mentioned amplifier or operational amplifier, respectively, especially an output thereof.

According to a further preferred implementation form of the first aspect of the invention, the analog-to-digital converter is configured to provide the digitized voltage for the measurement instrument, preferably a processor or controller of the measurement instrument. Advantageously, for instance, settings of the measurement instrument can efficiently be set in an automatic manner on the basis of the digitized voltage.

With respect to the processor or controller, respectively, it is noted that said processor or controller, respectively, can be comprised by the voltage measurement and/or overvoltage protection circuit. It is also possible that each of the measurement instrument and the voltage measurement and/or overvoltage protection circuit comprises a processor or controller, respectively, wherein the respective processors or controllers, respectively, are preferably interconnected. It is further noted that the processor or controller, respectively, especially an input thereof, may be connected to the above-mentioned analog-to-digital converter, especially an output thereof.

According to a further preferred implementation form of the first aspect of the invention, the voltage measurement and/or overvoltage protection circuit further comprises a processor for determining at least one measurement value, preferably in the form of a direct component and/or a frequency and/or a root mean square value, on the basis of the digitized voltage. Advantageously, for instance, said at least one measurement value can efficiently be provided for a display of the measurement instrument.

With respect to the processor, it is noted that said processor can especially be the processor or controller, respectively, as mentioned above. It is noted that the processor, especially an input thereof, may be connected to the above-mentioned analog-to-digital converter, especially an output thereof.

According to a further preferred implementation form of the first aspect of the invention, the processor is configured to provide the at least one measurement value for the measurement instrument. Advantageously, for example, the measurement instrument can comprise a display for displaying the at least one measurement value in an efficient manner. Further advantageously, a voltage display of the measurement instrument input voltage is independent of the respective scale and/or offset settings on the corresponding measurement channel. Accordingly, the user always sees immediately where exactly the center of the correspondingly inputted voltage is.

According to a further preferred implementation form of the first aspect of the invention, especially for the case that the at least one termination resistor is switchable between at least a first termination resistor comprising a first termination resistance and a second termination resistor comprising a second termination resistance being lower than said first termination resistance, the processor is configured to control the measurement instrument to switch to the first termination resistor if a defined voltage threshold is exceeded preferably with respect to the second termination resistor. Advantageously, for example, a particularly reliable overvoltage protection can be achieved in an efficient manner.

It is noted that it might be particularly advantageous if the measurement instrument comprises a termination resistor switch for switching between at least the first termination resistor and the second termination resistor. Said termination resistor switch may be in connection with the above-mentioned processor or controller, respectively.

With respect to the first termination resistance of the first termination resistor and the second termination resistance of the second termination resistor, it is noted that it might be particularly advantageous if the first termination resistance is at least 10,000 times higher, preferably at least 15,000 times higher, more preferably at least 20,000 times higher, most preferably at least 25,000 times higher, than the second termination resistance.

With respect to the first termination resistance, it is noted that said first termination resistance may be between 0.5 Megaohm and 5 Megaohm, preferably between 0.8 Megaohm and 4 Megaohm, more preferably between 0.9 Megaohm and 3 Megaohm, most preferably between 1 Megaohm and 2 Megaohm.

Additionally or alternatively, with respect to the second termination resistance, said second termination resistance may be between 10 Ohm and 150 Ohm, preferably between 20 Ohm and 100 Ohm, more preferably between 30 Ohm and 70 Ohm, most preferably between 40 Ohm and 60 Ohm.

With respect to the defined voltage threshold, it is noted that said defined voltage threshold can be a predefined or predetermined voltage threshold. Furthermore, said defined voltage threshold or predefined or predetermined voltage threshold, respectively, can be set during operation of the measurement instrument or the voltage measurement and/or overvoltage protection circuit, respectively, and/or in advance especially by a user.

According to a further preferred implementation form of the first aspect of the invention, especially for the case that the at least one termination resistor is switchable between at least a first termination resistor comprising a first termination resistance and a second termination resistor comprising a second termination resistance being lower than said first termination resistance, the processor is configured to control the measurement instrument to forbid switching to the second termination resistor if a defined voltage threshold is exceeded preferably with respect to the second termination resistor. Advantageously, for instance, it can efficiently and reliably be achieved to not to allow switching from the first termination resistor to the second termination resistor exemplarily in case of destructive voltage levels for the second termination resistor and/or voltages dangerous to touch especially from the beginning.

With respect to the first termination resistance, the second termination resistance, and the defined voltage threshold, it is noted that the above-mentioned explanations analogously apply. It is further noted that the defined voltage threshold can be the one as mentioned above or another one.

According to a further preferred implementation form of the first aspect of the invention, the voltage measurement and/or overvoltage protection circuit further comprises an additional analog-to-digital converter. In this context, especially for the case that the at least one termination resistor is switchable between at least a first termination resistor comprising a first termination resistance and a second termination resistor comprising a second termination resistance being lower than said first termination resistance, the additional analog-to-digital converter is configured to digitize a voltage provided by the first termination resistor if a defined voltage threshold is exceeded preferably with respect to the second termination resistor in order to provide an additional digitized voltage. Advantageously, for example, a higher bandwidth can be achieved, thereby increasing accuracy and efficiency.

With respect to the first termination resistance, the second termination resistance, and the defined voltage threshold, it is noted that the above-mentioned explanations analogously apply. It is further noted that the defined voltage threshold can be one of the ones as mentioned above or another one.

With respect to the additional analog-to-digital converter, it is noted that said additional analog-to-digital converter, especially an input thereof, may be contacted to the first termination resistor. Furthermore, said additional analog-to-digital converter, especially an output thereof, may be connected to the above-mentioned processor or controller, respectively, especially an input thereof.

According to a further preferred implementation form of the first aspect of the invention, the processor is configured to determine at least one additional measurement value, preferably in the form of a direct component and/or a frequency and/or a root mean square value, on the basis of the additional digitized voltage. Advantageously, for instance, said at least one additional measurement value can efficiently be provided for a display of the measurement instrument.

According to a further preferred implementation form of the first aspect of the invention, the processor is configured to provide the at least one additional measurement value for the measurement instrument. Advantageously, for example, the measurement instrument can comprise a display for displaying the at least one additional measurement value in an efficient manner.

According to a second aspect of the invention, a measurement instrument is provided. Said measurement instrument comprises a measurement channel with at least one termination resistor and a measurement port, and a voltage measurement and/or overvoltage protection circuit according to the first aspect of the invention or any of its preferred implementation forms, respectively, being contacted to the measurement port. Advantageously, measurements are performed in a highly accurate and efficient manner, wherein a safe operation of the measurement instrument can also be ensured.

According to a first preferred implementation form of the second aspect of the invention, the measurement instrument comprises or is an oscilloscope, a voltmeter, a power meter, a spectrum analyzer, or any combination thereof. Advantageously, for instance, a high flexibility can be guaranteed, thereby ensuring a high efficiency.

According to a second preferred implementation form of the second aspect of the invention, the measurement instrument further comprises a display for displaying at least one of the at least one measurement value and/or at least one of the at least one additional measurement value. Advantageously, for example, an efficient display of the respective measurement values can be ensured.

With respect to the display, it is noted that said display may be in connection with the above-mentioned processor or controller, respectively.

According to a further preferred implementation form of the second aspect of the invention, the voltage measurement and/or overvoltage protection circuit is active if the measurement channel is inactive. Advantageously, for instance, even if in some settings, respective measurement channels are inactive to assign their resources to another channel, voltage measurements and/or overvoltage protection still work.

According to a further preferred implementation form of the second aspect of the invention, the measurement port comprises or is a coaxial connector. In addition to this or as an alternative, the at least one termination resistor comprises at least a first termination resistor comprising a first termination resistance and a second termination resistor comprising a second termination resistance being lower than said first termination resistance. Further additionally or further alternatively, the measurement channel comprises a termination resistor switch for switching between at least a first termination resistor comprising a first termination resistance and a second termination resistor comprising a second termination resistance being lower than said first termination resistance. Advantageously, for example, the termination resistor switch can efficiently and reliably be controlled with the aid of the above-mentioned processor or controller, respectively.

With respect to the first termination resistance and the second termination resistance, it is noted that the above-mentioned explanations analogously apply. It is further noted that the termination resistor switch may be in connection with the above-mentioned processor or controller, respectively.

According to a third aspect of the invention, an overvoltage protection method is provided for operating a measurement instrument comprising a measurement channel with at least one termination resistor, said at least one termination resistor being switchable between at least a first termination resistor comprising a first termination resistance and a second termination resistor comprising a second termination resistance being lower than said first termination resistance, and a measurement port. Said overvoltage protection method comprises the steps of measuring a voltage with respect to the measurement port via at least one resistor, a resistance of said at least one resistor being higher than a maximum resistance of the at least one termination resistor, switching to the first termination resistor if a defined voltage threshold is exceeded preferably with respect to the second termination resistor, and/or forbidding switching to the second termination resistor if a defined voltage threshold is exceeded preferably with respect to the second termination resistor. Advantageously, measurements are performed in a highly accurate and efficient manner, wherein a safe operation of the measurement instrument can also be ensured.

BRIEF DESCRIPTION OF THE DRAWINGS

The above-described aspects and implementation forms of the present disclosure will be explained in the following description of specific embodiments in relation to the enclosed drawings, in which.

DETAILED DESCRIPTIONS OF EMBODIMENTS

Figure 1:
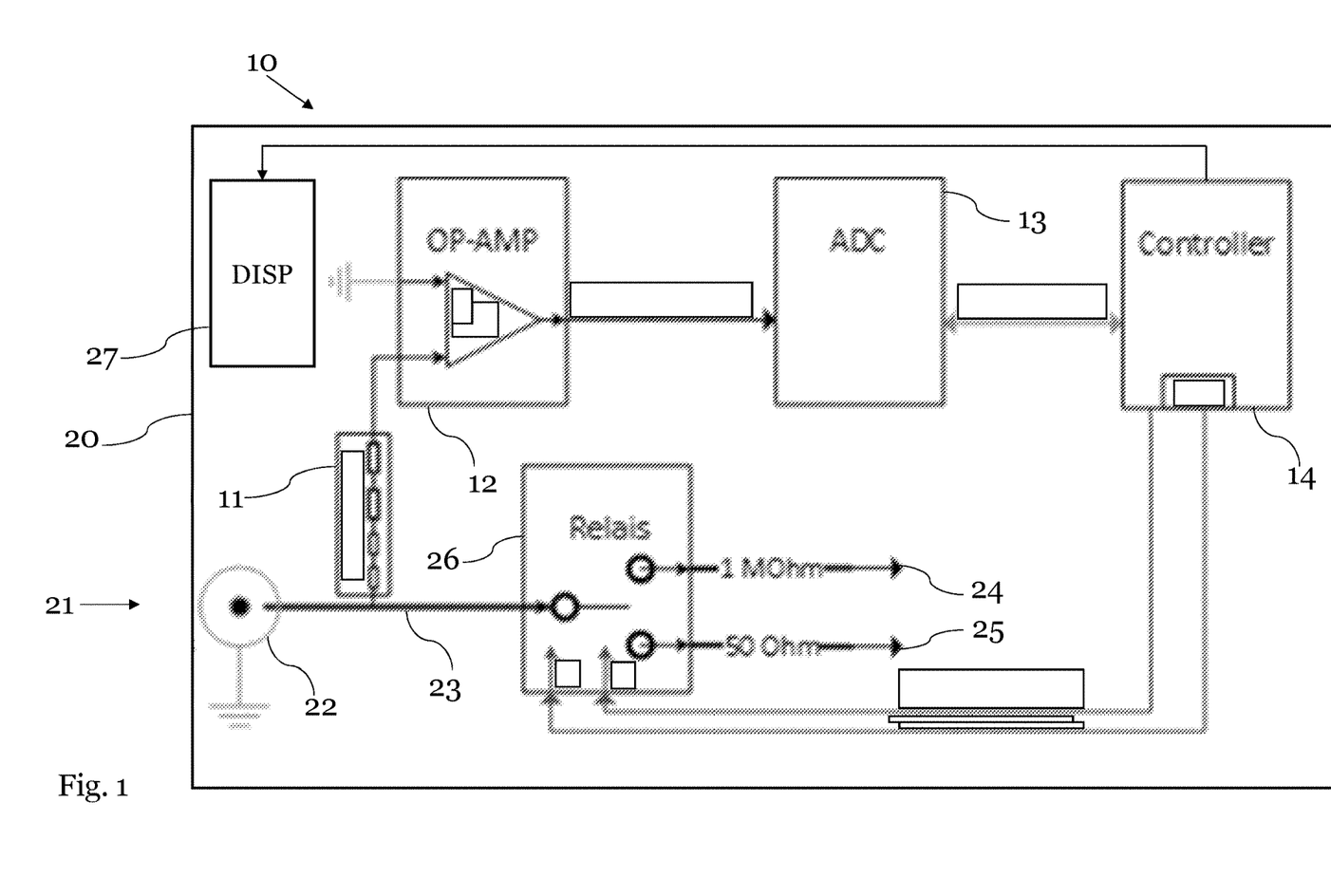
FIG. 1 shows an exemplary embodiment of the first aspect of the invention in combination with the second aspect of the invention.

With respect to FIG. 1, an exemplary embodiment of the inventive voltage measurement and/or overvoltage protection circuit 10 for a measurement instrument comprising a measurement channel with at least one termination resistor and a measurement port is depicted.

For the sake of completeness, it is noted that said FIG. 1 additionally illustrates an exemplary embodiment of the inventive measurement instrument 20 comprising a measurement channel 21 with at least one termination resistor, exemplarily the termination resistors 24, 25, and a measurement port 22, and said voltage measurement and/or overvoltage protection circuit 10 being contacted to said measurement port 22.

In accordance with FIG. 1, the voltage measurement and/or overvoltage protection circuit 10 comprises at least one resistor 11. In this context, the voltage measurement and/or overvoltage protection circuit 10 is contactable or exemplarily contacted, respectively, to the measurement port 22 via said at least one resistor 11.

In particular, in this exemplary case, the measurement port 22 is a coaxial connector, especially a coaxial input connector, comprising an inner conductor and ground. In this context, as it can be seen, the inner conductor is connected to a junction 23. In addition to this, the at least one resistor 11 is electrically connected to said junction 23.

Furthermore, a resistance of the at least one resistor 11 is higher than a maximum resistance of the at least one termination resistor, exemplarily the two termination resistors 24 and 25. In other words, the resistance of the at least one resistor 11 is higher than the resistance of the first termination resistor 24 and the resistance of the second termination resistor 25.

It is noted that it might be particularly advantageous if the resistance of the at least one resistor 11 is at least 10 times higher, preferably at least 15 times higher, more preferably at least 20 times higher, most preferably at least 25 times higher, than the maximum resistance of the at least one termination resistor, exemplarily the first termination resistor 24 and the second termination resistor 25. Exemplarily, the resistance of the at least one resistor 11 is 20 times the maximum resistance of the at least one termination resistor or the resistance of the first termination resistor 24, respectively.

With respect to a first termination resistance of the first termination resistor 24 and a second termination resistance of the second termination resistor 25, it might be particularly advantageous if the first termination resistance is at least 10,000 times higher, preferably at least 15,000 times higher, more preferably at least 20,000 times higher, most preferably at least 25,000 times higher, than the second termination resistance. Exemplarily, the first termination resistance is 20,000 times the second termination resistance. Further exemplarily, the first termination resistance 1 Megaohm, whereas the second termination resistance is 50 Ohm. Accordingly, the above-mentioned resistance of the at least one resistor 11 is 20 Megaohm.

Basically, it should be noted that it might be particularly advantageous if the resistance of the at least one resistor 11 is higher than the first termination resistance, whereas said first termination resistance is higher than the second termination resistance.

With respect to the above-mentioned at least one resistor 11, it is noted that it might be particularly advantageous if said at least one resistor 11 comprises at least a first resistor for contacting the measurement port 22 or the junction 23, respectively, and a second resistor following said first resistor. In this context, said second resistor may especially be connected in series to said first resistor.

Moreover, the first resistor may comprise or be of a first construction form, exemplarily a first surface-mounted device (SMD) construction form. Additionally, the second resistor may comprise or be of a second construction form, exemplarily a second SMD construction form. In this context, it might be particularly advantageous if the first construction form is smaller than the second construction form.

In particular, the first resistor may be of a first SMD construction form being not greater than 0201 or 0402. In addition to this or as an alternative, the second resistor may be of a second SMD construction form being at least 1206.

Furthermore, the first resistor may preferably be configured to keep a potential mismatch as small as possible especially with respect to the second termination resistor 25. Additionally or alternatively, the second resistor may preferably comprise a smaller temperature coefficient and/or a higher resistance than the first resistor.

As it can further be seen from FIG. 1, the voltage measurement and/or overvoltage protection circuit 10 further comprising an amplifier, exemplarily an operational amplifier 12, for dividing a voltage provided by the at least one resistor 11 according to a defined factor, exemplarily a twentieth, and/or buffering said voltage provided by the at least one resistor 11 in order to provide a divided and/or buffered voltage. Accordingly, an input of said operational amplifier 12 is connected to the at least one resistor 11 or a first terminal of the at least one resistor 11, respectively, whereas a second terminal of said at least one resistor 11 is connected to the junction 23. In addition to this, another input of the above-mentioned operational amplifier 12 can especially be connected to ground.

In particular, in the exemplary case that the at least one resistor 11 comprises at least the first resistor and the second resistor, an input of the operational amplifier 12 is connected to a first terminal of the second resistor, whereas a second terminal of said second resistor is connected to a first terminal of the first resistor. Additionally, a second terminal of said first resistor is connected to the above-mentioned junction 23.

Moreover, the voltage measurement and/or overvoltage protection circuit 10 further comprises an analog-to-digital converter 13 for digitizing the divided and/or buffered voltage in order to provide a digitized voltage. Accordingly, an input of the analog-to-digital converter 13 is connected to an output of the above-mentioned amplifier or operational amplifier 12, respectively.

With respect to the above-mentioned analog-to-digital converter 13, it is noted that said analog-to-digital converter 13 is configured to provide the digitized voltage for the measurement instrument 20, exemplarily a processor or controller 14, respectively, of the measurement instrument 20. Accordingly, an output of the above-mentioned analog-to-digital converter 13 is connected to an input of the processor or controller 14, respectively.

With respect to the above-mentioned processor or controller 14, respectively, of the measurement instrument 20, it is noted that said processor or controller 14, respectively, can also be comprised by the voltage measurement and/or overvoltage protection circuit 10. In this context, it is further noted that each of the measurement instrument 20 and the voltage measurement and/or overvoltage protection circuit 10 may comprise its own processor or controller, respectively, wherein said processors and/or controllers may preferably be in connection with respect to each other.

Furthermore, also with respect to the above-mentioned processor or controller 14, respectively, it is noted that said processor or controller 14, respectively, is exemplarily configured to determine at least one measurement value, preferably in the form of a direct component and/or a frequency and/or a root mean square value, on the basis of the digitized voltage.

In addition to this, the processor or controller 14, respectively, is exemplarily configured to provide the at least one measurement value for the measurement instrument 20, preferably a display 27 of the measurement instrument 20. Accordingly, the processor or controller 14, respectively, especially an output thereof, is connected the display 27, especially an input thereof. In addition to this, the display 27 is configured to display at least one of the at least one measurement value.

As it can further be seen from FIG. 1, the measurement instrument 20 comprises a termination resistor switch or an input impedance switch, respectively, exemplarily a relay 26, comprising an input being electrically connected to the junction 23 and a first output terminated with the first termination resistor 24 and a second output terminated with the second termination resistor 25. Accordingly, said termination resistor switch or said input impedance switch, respectively, exemplarily said relay 26, is configured to switch between said termination resistors 24 and 25.

It is noted that it might be particularly advantageous if, especially in the context of said termination resistor switch, the processor or controller 14, respectively, is configured to control the measurement instrument 20 or the termination resistor switch or the input impedance switch, respectively, exemplarily the relay 26, to switch to the first termination resistor 24 if a defined voltage threshold is exceeded preferably with respect to the second termination resistor 25. Accordingly, the processor or controller 14, respectively, is connected to the termination resistor switch or the input impedance switch, respectively, exemplarily the relay 26.

In addition to this or as an alternative, it might be particularly advantageous if, especially in the context of said termination resistor switch, the processor or controller 14, respectively, is configured to control the measurement instrument 20 or the termination resistor switch or the input impedance switch, respectively, exemplarily the relay 26, to forbid switching to the second termination resistor 25 if a defined voltage threshold is exceeded preferably with respect to the second termination resistor 25.

Figure 2:
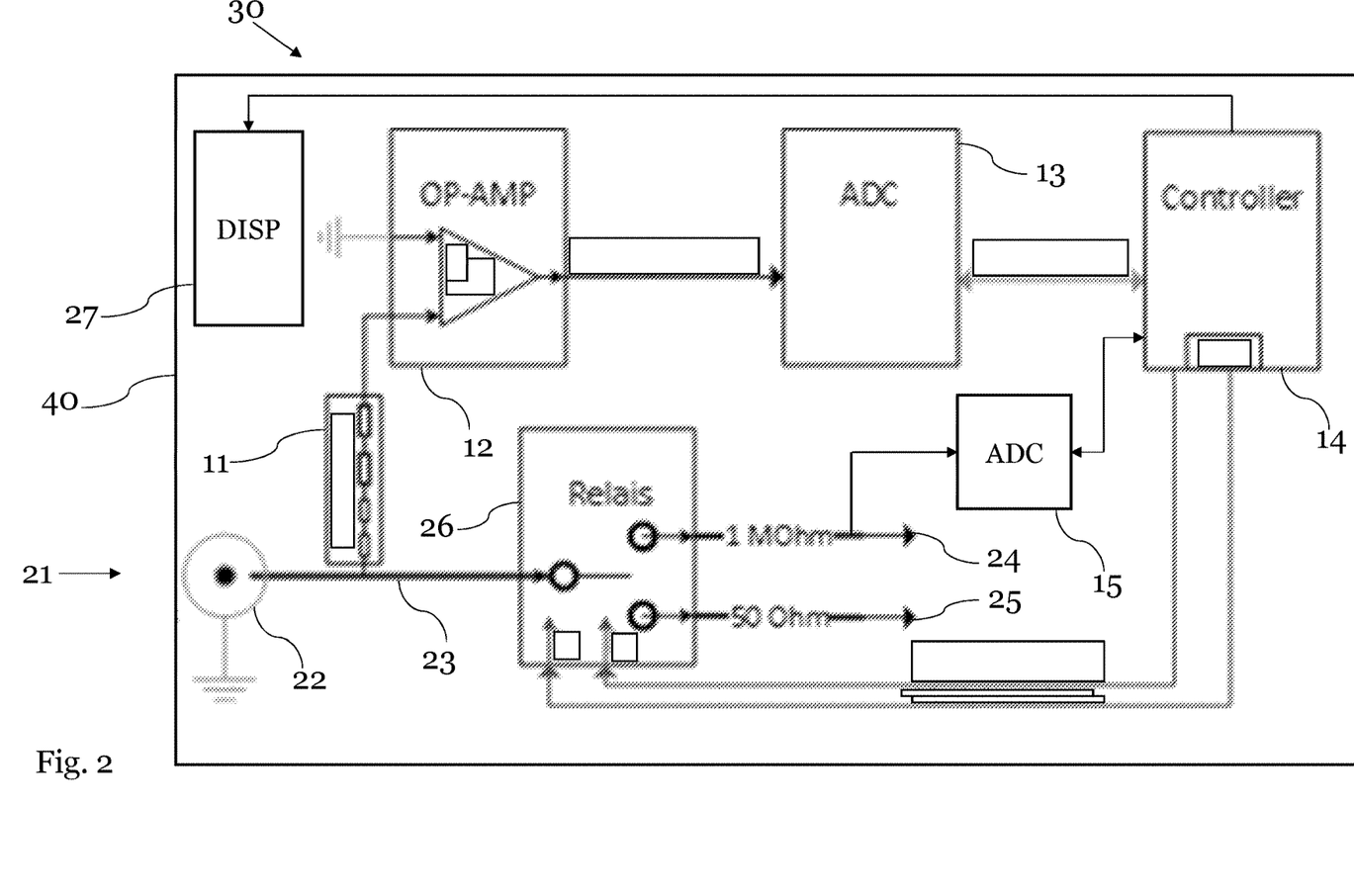
FIG. 2 shows a further exemplary embodiment of the first aspect of the invention in combination with the second aspect of the invention.

Now, with respect to FIG. 2, a further exemplary embodiment of the inventive voltage measurement and/or overvoltage protection circuit 30 for a measurement instrument comprising a measurement channel with at least one termination resistor and a measurement port is depicted.

By analogy with FIG. 1, it is noted that said FIG. 2 additionally illustrates an exemplary embodiment of the inventive measurement instrument 40 comprising a measurement channel 21 with at least one termination resistor, exemplarily the termination resistors 24, 25, and a measurement port 22, and said voltage measurement and/or overvoltage protection circuit 30 being contacted to said measurement port 22.

In this context, it is noted that for the sake of compactness, elements having already been explained above are not elucidated again but equipped with the same reference signs.

As it can be seen from FIG. 2, the embodiment according to FIG. 2 differs from the one of FIG. 1 especially in that the voltage measurement and/or overvoltage protection circuit 30 further comprises an additional analog-to-digital converter 15.

Especially in the context of the termination resistor switch or the input impedance switch, respectively, exemplarily the relay 26, the additional analog-to-digital converter 15 is configured to digitize a voltage provided by the first termination resistor 24 if a defined voltage threshold is exceeded preferably with respect to the second termination resistor 25 in order to provide an additional digitized voltage. Accordingly, an input of the additional analog-to-digital converter 15 is contacted to the first termination resistor 24.

It is noted that it might be particularly advantageous if the processor or the controller 14, respectively, is configured to determine at least one additional measurement value, preferably in the form of a direct component and/or a frequency and/or a root mean square value, on the basis of the additional digitized voltage. Accordingly, an output of the additional analog-to-digital converter 15 is connected to an input of the processor or the controller 14, respectively.

Furthermore, the processor or the controller 14, respectively, can be configured to provide the at least one additional measurement value for the measurement instrument 40 or the display 27, respectively. Accordingly, in addition to or as an alternative of displaying the at least one of the at least one measurement value, the display 27 can be configured to display at least one of the at least one additional measurement value.

With respect to the measurement instrument 20 of FIG. 1 or the measurement instrument 40 of FIG. 2, it is noted that it might be particularly advantageous if the respective measurement instrument comprises or is an oscilloscope, a voltmeter, a power meter, a spectrum analyzer, or any combination thereof.

In addition to this or as an alternative, it might be particularly advantageous if the voltage measurement and/or overvoltage protection circuit 10 according to FIG. 1 or the voltage measurement and/or overvoltage protection circuit 30 of FIG. 2, respectively, is active if the measurement channel 21 is inactive.

Figure 3:
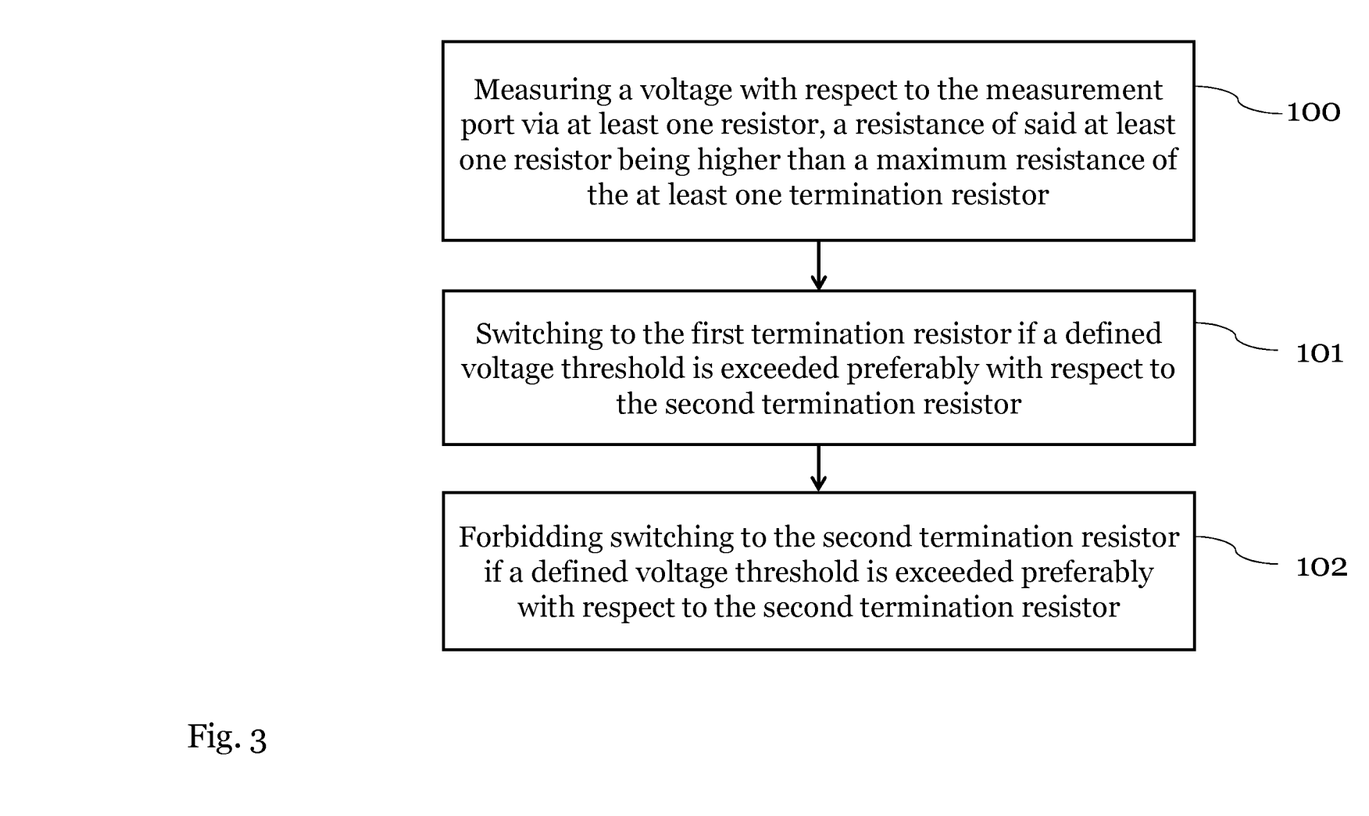
FIG. 3 shows a flow chart of an exemplary embodiment of the third aspect of the invention.

Finally, FIG. 3 illustrates a flow chart of an exemplary embodiment of the inventive overvoltage protection method for operating a measurement instrument comprising a measurement channel with at least one termination resistor, said at least one termination resistor being switchable between at least a first termination resistor comprising a first termination resistance and a second termination resistor comprising a second termination resistance being lower than said first termination resistance, and a measurement port. A first step 100 of said overvoltage protection method comprises measuring a voltage with respect to the measurement port via at least one resistor, a resistance of said at least one resistor being higher than a maximum resistance of the at least one termination resistor. Furthermore, a second step 101 comprises switching to the first termination resistor if a defined voltage threshold is exceeded preferably with respect to the second termination resistor. In addition to this or as an alternative, a thid step 102 comprises forbidding switching to the second termination resistor if a defined voltage threshold is exceeded preferably with respect to the second termination resistor.

While various embodiments of the present invention have been described above, it should be understood that they have been presented by way of example only, and not limitation. Numerous changes to the disclosed embodiments can be made in accordance with the disclosure herein without departing from the spirit or scope of the invention. Thus, the breadth and scope of the present invention should not be limited by any of the above-described embodiments. Rather, the scope of the invention should be defined in accordance with the following claims and their equivalents.

Although the invention has been illustrated and described with respect to one or more implementations, equivalent alterations and modifications will occur to others skilled in the art upon the reading and understanding of this specification and the annexed drawings. In addition, while a particular feature of the invention may have been disclosed with respect to only one of several implementations, such feature may be combined with one or more other features of the other implementations as may be desired and advantageous for any given or particular application.

What is claimed is:

1. A voltage measurement or overvoltage protection circuit or any combination thereof for a measurement instrument comprising a measurement channel with at least one termination resistor and a measurement port,
    said voltage measurement or overvoltage protection circuit or any combination thereof comprising:
        at least one resistor,
        wherein the voltage measurement or overvoltage protection circuit or any combination thereof is contactable to the measurement port via said at least one resistor, and
        wherein a resistance of the at least one resistor is higher than a maximum resistance of the at least one termination resistor.

2. The voltage measurement or overvoltage protection circuit or any combination thereof according to claim 1,
    wherein the resistance of the at least one resistor is selected from at least 10 times higher, at least 15 times higher, at least 20 times higher, or at least 25 times higher, than the maximum resistance of the at least one termination resistor.

3. The voltage measurement or overvoltage protection circuit or any combination thereof according to claim 1,
    wherein the at least one resistor comprises at least a first resistor for contacting the measurement port and a second resistor following said first resistor.

4. The voltage measurement or overvoltage protection circuit or any combination thereof according to claim 3,
    wherein the first resistor comprises or is of a first construction form,
    wherein the second resistor comprises or is of a second construction form, and
    wherein the first construction form is smaller than the second construction form.

5. The voltage measurement or overvoltage protection circuit or any combination thereof according to claim 1, said voltage measurement or overvoltage protection circuit or any combination thereof further comprising:
    an amplifier for dividing a voltage provided by the at least one resistor according to a defined factor, or buffering said voltage provided by the at least one resistor in order to provide a divided or buffered voltage, or any combination thereof.

6. The voltage measurement or overvoltage protection circuit or any combination thereof according to claim 5, said voltage measurement or overvoltage protection circuit or any combination thereof further comprising:
    an analog-to-digital converter for digitizing the divided or buffered voltage or any combination thereof in order to provide a digitized voltage.

7. The voltage measurement or overvoltage protection circuit or any combination thereof according to claim 6,
    wherein the analog-to-digital converter is configured to provide the digitized voltage for the measurement instrument.

8. The voltage measurement or overvoltage protection circuit or any combination thereof according to claim 6, said voltage measurement or overvoltage protection circuit or any combination thereof further comprising:
    a processor for determining at least one measurement value on the basis of the digitized voltage.

9. The voltage measurement or overvoltage protection circuit or any combination thereof according to claim 8,
    wherein the processor is configured to provide the at least one measurement value for the measurement instrument.

10. The voltage measurement or overvoltage protection circuit or any combination thereof according to claim 8,
    wherein, when the at least one termination resistor is switchable between at least a first termination resistor comprising a first termination resistance and a second termination resistor comprising a second termination resistance being lower than said first termination resistance, the processor is configured to control the measurement instrument to switch to the first termination resistor if a defined voltage threshold is exceeded.

11. The voltage measurement or overvoltage protection circuit or any combination thereof according to claim 8,
    wherein, when the at least one termination resistor is switchable between at least a first termination resistor comprising a first termination resistance and a second termination resistor comprising a second termination resistance being lower than said first termination resistance, the processor is configured to control the measurement instrument to forbid switching to the second termination resistor if a defined voltage threshold is exceeded.

12. The voltage measurement or overvoltage protection circuit or any combination thereof according to claim 8, said voltage measurement or overvoltage protection circuit or any combination thereof further comprising:
    an additional analog-to-digital converter,
    wherein, when the at least one termination resistor is switchable between at least a first termination resistor comprising a first termination resistance and a second termination resistor comprising a second termination resistance being lower than said first termination resistance, the additional analog-to-digital converter is configured to digitize a voltage provided by the first termination resistor if a defined voltage threshold is exceeded in order to provide an additional digitized voltage.

13. The voltage measurement or overvoltage protection circuit or any combination thereof according to claim 12, wherein the processor is configured to determine at least one additional measurement value, in the form of a direct component, a frequency, a root mean square value, or any combination thereof, on the basis of the additional digitized voltage.

14. The voltage measurement or overvoltage protection circuit or any combination thereof according to claim 13, wherein the processor is configured to provide the at least one additional measurement value for the measurement instrument.

15. A measurement instrument comprising:
the measurement channel with the at least one termination resistor and the measurement port, and
the voltage measurement or overvoltage protection circuit or any combination thereof according to claim 1 being contacted to the measurement port.

16. The measurement instrument according to claim 15, wherein the measurement instrument comprises or is an oscilloscope, a voltmeter, a power meter, a spectrum analyzer, or any combination thereof.

17. The measurement instrument according to claim 15, said measurement instrument further comprising:
a display for displaying at least one measurement value.

18. The measurement instrument according to claim 15, wherein the voltage measurement or overvoltage protection circuit or any combination thereof is active if the measurement channel is inactive.

19. The measurement instrument according to claim 15, wherein the measurement port comprises or is a coaxial connector, or
wherein the at least one termination resistor comprises at least a first termination resistor comprising a first termination resistance and a second termination resistor comprising a second termination resistance being lower than said first termination resistance, or
wherein the measurement channel comprises a termination resistor switch for switching between at least a first termination resistor comprising a first termination resistance and a second termination resistor comprising a second termination resistance being lower than said first termination resistance,
or any combination thereof.

20. An overvoltage protection method for operating a measurement instrument comprising a measurement channel with at least one termination resistor, a measurement port, and a voltage measurement or overvoltage protection circuit or any combination thereof being contacted to the measurement port,
said at least one termination resistor being switchable between at least a first termination resistor comprising a first termination resistance and a second termination resistor comprising a second termination resistance being lower than said first termination resistance, said overvoltage protection method comprising the steps of:
measuring a voltage with respect to the measurement port via at least one resistor, a resistance of said at least one resistor being higher than a maximum resistance of the at least one termination resistor,
switching to the first termination resistor if a defined voltage threshold is exceeded with respect to the second termination resistor, or
forbidding switching to the second termination resistor if the defined voltage threshold is exceeded with respect to the second termination resistor.

* * * * *